US011740559B2

(12) United States Patent
Waller et al.

(10) Patent No.: US 11,740,559 B2
(45) Date of Patent: *Aug. 29, 2023

(54) APPARATUSES FOR REDUCING METAL RESIDUE IN EDGE BEAD REGION FROM METAL-CONTAINING RESISTS

(71) Applicant: Inpria Corporation, Corvallis, OR (US)

(72) Inventors: Mollie Waller, Corvallis, OR (US); Brian J. Cardineau, Corvallis, OR (US); Kai Jiang, Corvallis, OR (US); Alan J. Telecky, Albany, OR (US); Stephen T. Meyers, Corvallis, OR (US); Benjamin L. Clark, Corvallis, OR (US)

(73) Assignee: Inpria Corporation, Corvallis, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/498,437

(22) Filed: Oct. 11, 2021

(65) Prior Publication Data

US 2022/0028685 A1 Jan. 27, 2022

Related U.S. Application Data

(60) Continuation of application No. 16/810,924, filed on Mar. 6, 2020, now Pat. No. 11,187,986, which is a
(Continued)

(51) Int. Cl.
*H01L 21/02* (2006.01)
*H01L 21/027* (2006.01)
(Continued)

(52) U.S. Cl.
CPC ............ *G03F 7/422* (2013.01); *G03F 7/0042* (2013.01); *G03F 7/162* (2013.01); *G03F 7/168* (2013.01);
(Continued)

(58) Field of Classification Search
None
See application file for complete search history.

(56) References Cited

U.S. PATENT DOCUMENTS 6,566,276 B2 5/2003 Maloney et al.
8,227,182 B2 6/2012 Lee et al.
(Continued)

FOREIGN PATENT DOCUMENTS

JP 2005-332950 A 12/2005
JP 2007-134671 A 5/2007
(Continued)

OTHER PUBLICATIONS

Jiang et al., "Metal Oxide Nanoparticle Photoresists for EUV Patterning," Journal of Photopolymer Science and Technology, 27(5), 663-666, (2014).
(Continued)

*Primary Examiner* — Xiaoming Liu
(74) *Attorney, Agent, or Firm* — Christensen, Fonder, Dardi & Herbert PLLC; Diane E. Bennett; Peter S. Dardi

(57) ABSTRACT

Apparatuses and methods are described for removing edge bead on a wafer associated with a resist coating comprising a metal containing resist compositions. The methods can comprise applying a first bead edge rinse solution along a wafer edge following spin coating of the wafer with the metal based resist composition, wherein the edge bead solution comprises an organic solvent and an additive comprising a carboxylic acid, an inorganic fluorinated acid, a tetraalkylammonium compound, or a mixture thereof. Alternatively or additionally, the methods can comprise applying a protective composition to the wafer prior to performing an edge bead rinse. The protective composition can be a sacrificial material or an anti-adhesion material and can be applied only to the wafer edge or across the entire wafer in the case of the protective composition. Corresponding appa-
(Continued)

ratuses for processing the wafers using these methods are presented.

20 Claims, 3 Drawing Sheets

Related U.S. Application Data division of application No. 15/674,934, filed on Aug. 11, 2017, now Pat. No. 10,627,719.

(60) Provisional application No. 62/430,722, filed on Dec. 6, 2016, provisional application No. 62/374,582, filed on Aug. 12, 2016.

(51) Int. Cl.
*H01L 21/67* (2006.01)
*G03F 7/42* (2006.01)
*G03F 7/16* (2006.01)
*G03F 7/004* (2006.01)

(52) U.S. Cl.
CPC .... *H01L 21/0273* (2013.01); *H01L 21/02087* (2013.01); *H01L 21/67051* (2013.01)

(56) References Cited

U.S. PATENT DOCUMENTS

| | | | |
|---|---|---|---|
| 8,826,926 B2 | 9/2014 | Chalom et al. | |
| 9,176,377 B2 | 11/2015 | Stowers et al. | |
| 9,310,684 B2 | 4/2016 | Meyers et al. | |
| 9,508,558 B2 | 11/2016 | Lin | |
| 10,627,719 B2 * | 4/2020 | Waller | H01L 21/0273 |
| 11,187,986 B2 * | 11/2021 | Waller | G03F 7/422 |
| 2003/0173223 A1 | 9/2003 | Gascoyne et al. | |
| 2004/0169012 A1 | 9/2004 | Carpenter et al. | |
| 2005/0096237 A1 * | 5/2005 | Miyazawa | C23G 1/24 |
| | | | 257/E21.228 |
| 2006/0003591 A1 | 1/2006 | Cheng et al. | |
| 2006/0086372 A1 | 4/2006 | Mellies et al. | |
| 2006/0228533 A1 | 10/2006 | Nakagawa | |
| 2007/0082134 A1 | 4/2007 | Fukuda et al. | |
| 2007/0254476 A1 * | 11/2007 | Chou | C11D 7/265 |
| | | | 134/2 |
| 2009/0155546 A1 | 6/2009 | Yamashita et al. | |
| 2010/0051922 A1 | 3/2010 | Hotta et al. | |
| 2010/0136486 A1 | 6/2010 | Harada et al. | |
| 2013/0224652 A1 | 8/2013 | Bass et al. | |
| 2014/0038423 A1 | 2/2014 | Iwao et al. | |
| 2014/0190529 A1 * | 7/2014 | Ganesan | H01L 21/02068 |
| | | | 134/95.1 |
| 2015/0056542 A1 * | 2/2015 | Meyers | G03F 7/32 |
| | | | 430/296 |
| 2015/0214085 A1 | 7/2015 | Jin et al. | |
| 2015/0303071 A1 * | 10/2015 | Storck | H01L 21/0262 |
| | | | 438/476 |
| 2016/0013041 A1 | 1/2016 | Liu et al. | |
| 2016/0116839 A1 | 4/2016 | Meyers et al. | |
| 2017/0102612 A1 | 4/2017 | Meyers et al. | |
| 2017/0207080 A1 | 7/2017 | Kuga | |
| 2018/0047562 A1 | 2/2018 | deVillers et al. | |
| 2018/0315623 A1 * | 11/2018 | Tanaka | B05B 1/28 |

FOREIGN PATENT DOCUMENTS

| | | |
|---|---|---|
| JP | 2014-045171 A | 3/2014 |
| KR | 10-2006-0113906 A | 11/2006 |
| KR | 10-1497199 B1 | 2/2015 |
| TW | 2005-08419 A | 3/2005 |
| TW | I260044 | 8/2006 |
| TW | 2007-40989 A | 11/2007 |
| TW | 2015-27872 A | 7/2015 |
| WO | 2015-121947 A1 | 8/2015 |
| WO | 2016-065120 A1 | 4/2016 |

OTHER PUBLICATIONS

International Search Report and Written Opinion For International Application No. PCT/US2017/046518 dated Nov. 24, 2017 (17 pages).
Office Action from co-pending Taiwan Patent Application No. 106127303 dated Aug. 5, 2020.
Office Action from co-pending Japanese Patent Application No. 2019-507178 dated Mar. 2, 2021.
Preliminary Rejection from co-pending Korean Patent Application No. 10-2019-7006755 dated Apr. 2, 2021.
Office Action from co-pending Taiwan Patent Application No. 110109583 dated Oct. 7, 2022. (Google Translation).

* cited by examiner ures for Reducing Metal Residue in Edge Bead Region from Metal-Containing Resists," which is a divisional of U.S. patent application Ser. No. 15/674,934 filed Aug. 11, 2017, now U.S. Pat. No. 10,627,719, to Waller et al., entitled "Method of Reducing Metal Residue in Edge Bead Region from Metal Containing Resists," which claims priority to U.S. provisional patent applications 62/374,582 filed Aug. 12, 2016 to Clark et al., entitled "Bead Washing for Metal Oxide Based Resists," and 62/430,722 filed Dec. 6, 2016 to Cardineau et al., entitled "Method of Reducing Metal Residue in Edge Bead Region from Metal Containing Resists," all of which are incorporated herein by reference.

APPARATUSES FOR REDUCING METAL RESIDUE IN EDGE BEAD REGION FROM METAL-CONTAINING RESISTS

CROSS REFERENCE TO RELATED APPLICATIONS

This application is a continuation of U.S. patent application Ser. No. 16/810,924 filed on Mar. 6, 2020 to Waller et al., entitled "Apparatuses for Reducing Metal Residue in Edge Bead Region from Metal-Containing Resists," which is a divisional of U.S. patent application Ser. No. 15/674,934 filed Aug. 11, 2017, now U.S. Pat. No. 10,627,719, to Waller et al., entitled "Method of Reducing Metal Residue in Edge Bead Region from Metal Containing Resists," which claims priority to U.S. provisional patent applications 62/374,582 filed Aug. 12, 2016 to Clark et al., entitled "Bead Washing for Metal Oxide Based Resists," and 62/430,722 filed Dec. 6, 2016 to Cardineau et al., entitled "Method of Reducing Metal Residue in Edge Bead Region from Metal Containing Resists," all of which are incorporated herein by reference.

FIELD OF THE INVENTION

The invention relates to processing to reduce metal contamination along wafer edges potentially resulting from the use of metal based patterning resists.

BACKGROUND OF THE INVENTION

The processing of semiconductor circuits and devices has involved the continued shrinkage of critical dimensions over each generation. As these dimensions shrink, new materials and methods are required to meet the demands of processing and patterning smaller and smaller features. Patterning generally involves selective exposure of a thin layer of a radiation sensitive material (resist) to form a pattern that is then transferred into subsequent layers or functional materials. Promising new classes of metal based radiation resists especially suitable for providing good absorption of extreme UV light and electron beam radiation, while simultaneously providing very high etch contrast have been discovered. To provide for commercialization of these new classes of resists, consideration of the process integration for the achievement of desired final products can be a significant step.

SUMMARY OF THE INVENTION

In a first aspect, the invention pertains to a method for removing edge bead on a wafer associated with a resist coating comprising a resist composition comprising metal, in which the method comprises the step of applying a first bead edge rinse solution along a wafer edge following spin coating of the wafer with the resist composition. In some embodiments, the edge bead solution comprises an organic solvent and an additive comprising a carboxylic acid, an inorganic fluorinated acid, a tetraalkylammonium compound, or a mixture thereof.

In a further aspect, the invention pertains to a method for preparing a wafer for radiation based patterning, in which the method comprises applying a protective composition to the wafer; spin coating a resist composition comprising metal after applying the protective composition; and performing edge bead rinse after spin coating the resist composition through application of an edge bead rinse solution along the edge of the wafer.

In other aspects, the invention pertains to an apparatus comprising a spindle comprising a wafer support, a dispenser with a nozzle configured to deposit fluid along an edge of a wafer mounted on the spindle, and a reservoir of fluid configured to deliver the fluid to the nozzle for dispensing. Generally, the spindle is operably connected to a motor configured to rotate the spindle. In some embodiments, the fluid comprises an organic solvent with an additive comprising a surface modification agent, an acidic compound, a tetraalkylammonium compound, or mixtures thereof.

DETAILED DESCRIPTION

Figure 1:
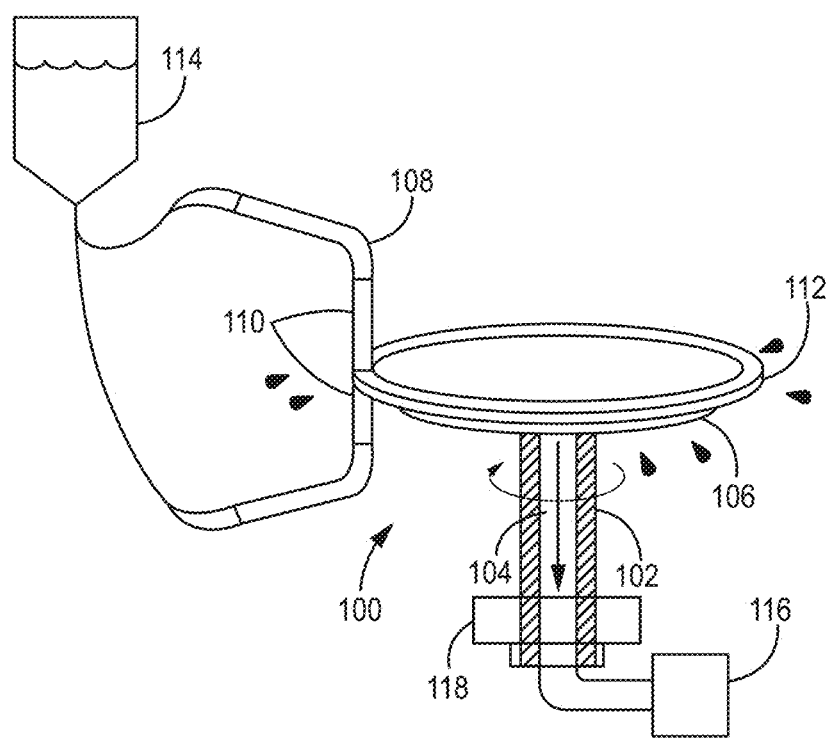
FIG. 1 is schematic perspective view of an edge bead rinse apparatus shown with a wafer positions for processing to perform an edge bead rinse.

Edge bead removal processes have been developed to more effectively remove metal and organometallic based resist materials and residues. Substrate edge resist build up can be removed prior to patterning a substrate with radiation to reduce contamination of process equipment with resist material. Edge bead removal solutions designed for traditional organic photoresists may not be sufficiently effective with the removal of metal containing resists. Improved edge bead removal solutions can use a selected solvent and may further contain an additive, such as an acid, to facilitate the removal of resist build up. In additional or alternative embodiments, a sacrificial layer, e.g., a polymer layer, can be placed over the wafer edge or over the entire wafer surface to facilitate removal of resist from the bead edge. Furthermore, an anti-adhesion layer, e.g., a coating with a sufficiently low critical surface tension, can be placed along the substrate edge to reduce or eliminate initial adherence of resist along the substrate edge. Due to the improved patterning abilities of metal-based resists, especially for fine patterning with extreme ultraviolet (EUV) light, it is advantageous to provide processing approaches that allow the effective incorporation of metal-based resists into patterning processes with the corresponding sophisticated equipment. Thus, the processing and corresponding compositions described herein provide a significant contribution to the commercialization of metal-based resists. As used herein, substrate and wafer are used interchangeably unless stated otherwise to refer to structures generally but necessarily cylindrical in shape usually with a small thickness relative to dimensions associated with a planar extent.

New rinse solutions are identified for processing of wafers coated with metal based or metal-containing patterning resists to aid in the removal of edge beads. Resist compositions comprising metal can generally be considered as comprising more than a contaminant amount of metal, such as at least 0.1 weight percent metal, and some metal containing resist of particular interest are described further below. For the fine patterning of semiconductors as well as for other radiation based lithographic processing, patterning resists are generally spin coated onto a wafer to form a relatively uniform resist layer over most of the wafer surface. Spin coating can result in a bead along the wafer edge with a buildup of resist relative to the resist layer covering the majority of the wafer, even though some of the excess resist may spin off of the wafer surface. It is generally desirable for the edge bead to be removed to facilitate processing of the wafer for patterning since the edge itself is not patterned using lithography, and to reduce contamination. For the effective removal of the edge bead for metal-based or metal-containing resists, new rinse compositions can comprise a suitable organic solvent and an additive, such as a carboxylic acid, an inorganic fluorinated acid, a tetraalkylammonium fluoride with a strong acid, or a combination thereof. Edge bead removal for metal based or metal-containing resists can also be helpful to reduce undesirable residual metal following the patterning process. After the bead edge rinse, patterning of the wafer generally continues using usual steps for the patterning based on the resist.

During photoresist processing, an edge bead removal (EBR) rinse step generally is used. EBR processing typically occurs prior to any thermal processing or baking following deposition of the photoresist and involves rinsing the peripheral edge of a wafer or substrate with a solvent to remove the photoresist in selected regions. This EBR process serves to reduce contamination of tools and machinery that handle or manipulate the wafers or substrates. With the use of metal-based photoresists, reducing the residual amount of metal, e.g., tin, in the EBR region is desirable. Standard EBR solvents based on organic solvents designed for removing polymer resists may not be effective alone to a desirable degree at reducing the residual metal, e.g., tin, concentration on the edge region of the wafer surface to desired levels. Additionally, the methods and materials described herein may be advantageous for processing resists containing a wide range of different metals, including Hf, Zr, In, Te, Sb, Ni, Co, Ti, W, Ta, Mo, and combinations thereof, and such use is contemplated by the present disclosure.

The new class of radiation based resists can be based on metal oxide chemistry (metal oxo/hydroxo compositions) using radiation sensitive ligands to control stability and processability of the resists. A first set of the new radiation based resists use peroxo ligands as the radiation sensitive stabilization ligands. Peroxo based metal oxo-hydroxo compounds are described, for example, in U.S. Pat. No. 9,176, 377B2 to Stowers et al., entitled "Patterned Inorganic Layers, Radiation Based Patterning Compositions and Corresponding Methods," incorporated herein by reference. Related resist compounds are discussed in published U.S. patent application 2013/0224652A1 to Bass et al., entitled "Metal Peroxo Compounds With Organic Co-ligands for Electron Beam, Deep UV and Extreme UV Photoresist Applications," incorporated herein by reference. An effective type of resists have been developed with alkyl ligands as described in U.S. Pat. No. 9,310,684B2 to Meyers et al., entitled "Organometallic Solution Based High Resolution Patterning Compositions," published U.S. patent application 2016/0116839A1 to Meyers et al., entitled "Organometallic Solution Based High Resolution Patterning Compositions and Corresponding Methods," and U.S. patent application Ser. No. 15/291,738 entitled "Organotin Oxide Hydroxide Patterning Compositions, Precursors, and Patterning", all of which are incorporated herein by reference. Tin compositions are exemplified in these documents, and the data presented herein focuses on tin-based resists, although the Edge bead removal solutions described herein are expected to be effective for other metal based resists described below.

With respect to the tin based resists of particular interest, these resists are based on the chemistry of organometallic compositions represented by the formula $R_z SnO_{(2-(z/2)-(x/2))}(OH)_x$ where $0<z\le2$ and $0<(z+x)\le4$, in which R is a hydrocarbyl group with 1-31 carbon atoms. However, it has been found that at least some of the oxo/hydroxo ligands can be formed following deposition based on in situ hydrolysis based on compositions represented by the formula $R_n SnX_{4-n}$ where n=1 or 2, in which X is a ligand with a hydrolysable M—X bond. In general, suitable hydrolysable ligands (X in $RSnX_3$) may include alkynides RC≡C, alkoxides $RO^-$, azides $N_3^-$, carboxylates $RCOO^-$, halides and dialkylamides. Thus, in some embodiments all or a portion for the oxo-hydroxo compositions can be substituted with the Sn—X compositions or a mixture thereof The R—Sn bonds generally are radiation sensitive and form the basis for the radiation processable aspect of the resist. But some of the $R_z SnO_{(2-(z/2)-(z/2))}(OH)_x$ composition can be substituted with $MO_{((m/2)-1/2)}(OH)_1$ where $0<z\le2$, $0<(z+w)\le4$, m=formal valence of $M^{m+}$, $0\le1\le m$, y/z=(0.05 to 0.6), and M=M' or Sn, where M' is a non-tin metal of groups 2-16 of the periodic table, and R is hydrocarbyl groups with 1-31 carbon atoms. Thus the resist being processed during the edge bead rinse can comprise a selected blend of $R_z SnO_{(2-(z/2)-(x/2))}(OH)_x$, $R'_n SnX_{4-n}$, and/or $MO_{((m/2)-1/2)}(OH)_1$, in which generally a significant fraction of the composition includes alkyl-tin bonds. Other resist compositions include, for example, compositions having metal carboxylate bonds (e.g., ligands of acetate, propanoate, butanoate, benzoate, and/or the like), such as dibutyltin diacetate.

While metal oxo/hydroxo or carboxylate based resists referenced above are particularly desirable, some other high performance resists may be suitable in some embodiments. Specifically, other metal-based resists include those with high etch selectivity to the template, fill material, and buffer hardmask. These may include resists such as metal-oxide nanoparticle resists (e.g., Jiang, Jing; Chakrabarty, Souvik; Yu, Mufei; et al., "Metal Oxide Nanoparticle Photoresists for EUV Patterning", Journal Of Photopolymer Science And Technology 27(5), 663-666 2014, incorporated herein by reference), or other metal containing resists (A Platinum-Fullerene Complex for Patterning Metal Containing Nanostructures, D. X. Yang, A. Frommhold, D. S. He, Z. Y. Li, R. E. Palmer, M. A. Lebedeva, T. W. Chamberlain, A. N. Khlobystov, A. P. G. Robinson, Proc SPIE Advanced Lithography, 2014, incorporated herein by reference). Other metal-based resists are described in published U.S. patent application 2009/0155546A1 to Yamashita et al., entitled "Film-Forming Composition, Method for Pattern Formation, and Three-Dimensional Mold," and U.S. Pat. No.

6,566,276 to Maloney et al., entitled "Method of Making Electronic Materials," both of which are incorporated herein by reference.

In electronics processing, it is generally desirable to mitigate trace metal contamination, so with the use of organometallic based resists, it is desirable to remove tin and/or other metal residue potentially resulting from the resists. The improved edge bead removal solutions generally comprise an organic solvent and one or more additives where the additives can improve the metal removal. Suitable additives include, for example, organic acids, inorganic fluoroacids, tetraalkylammonium halides, and mixtures thereof. Suitable additives may also function as complexing or chelating agents such as carboxylates, dicarboxylates, halides, phosphates, phosphonates, sulfates, sulfonates, and mixtures thereof. The additives may also function as surfactants and/or chelating agents. Thus, the conjugate anions of the various acids listed herein can be added as chelating agents. Also, surfactants, such as Triton™-X, a non-ionic surfactant, can also be used as additives. The additives can be selected to be soluble in the organic solvent. The solutions can comprise additive from about 0.1 wt % to about 25 wt %, in further embodiments from about 0.2 wt % to about 20 wt % and in additional embodiments from about 0.25 wt % to about 20 wt %. A person of ordinary skill in the art will recognize that additional ranges of additive concentrations within the explicit ranges above are contemplated and are within the present disclosure. Suitable organic solvents include, for example, glycol ethers and esters thereof, such as propylene glycol methyl ether (PGME), propylene glycol methyl ether acetate (PGMEA), propylene glycol butyl ether (PGBE), ethylene glycol methyl ether, and/or the like; alcohols, such as ethanol, propanol, isopropyl alcohol, isobutyl alcohol, hexanol, ethylene glycol, propylene glycol, and/or the like; cyclic esters, such as gamma-butyrolactone; esters, such as n-butyl acetate, ether acetate, or the like, and/or mixtures thereof; ketones, such as heptanone, and/or the like; liquid cyclic carbonates, such as propylene carbonate, butylene carbonate, and/or the like; and any mixtures thereof. A blended solvent with about 50 to about 90 wt % PGMEA, about 1 wt % to about 20 wt % PGME, about 1 wt % to about 10 wt % γ-buryrolactone and about 1 wt % to about 20 wt % n-butyl acetate has been proposed as a desirable EBR solution with desirable rheology and evaporation properties in U.S. Pat. No. 8,227,182 to Lee et al., entitled "Methods of Forming a Photosensitive Film," incorporated herein by reference. Suitable organic acids include, for example, carboxylic acids, such as acetic acid, citric acid, oxalic acid, 2-nitrophenylacetic acid, 2-ethylhexanoic acid, dodecanoic acid, and/or the like; sugar acids, such as ascorbic acid, tartaric acid, glucuronic acid, and/or the like; sulfonic acids, such as benzene sulfonic acid, p-toluenesulphonic acid, and/or the like; phosphate esters and phosphoric acids, such as bis(2-ethylhexyl) phosphoric acid; hydrofluoric acid (HF); sulfuric acid ($H_2SO_4$); and any mixtures thereof. Suitable inorganic fluoroacids include, for example, hexafluorosilicic acid, hexafluorophosphoric acid, fluoroboric acid and/or the like. Suitable tetraalkylammonium compounds include, for example, tetramethylammonium fluoride, tetrabutylammonium fluoride, tetrabutylammonium fluorosilicate, and/or the like, or mixtures thereof.

Multiple rinse steps can be performed to achieve desired levels of edge cleaning. In some embodiments, an edge rinse can be performed once, twice, three times, four times, five times, six times, ten times, or more than ten times with the same solution to achieve desired metal reduction. Furthermore, two different rinse solutions can be applied during an edge bead rinse process. Each different solution can be selected independently from the solutions described above. For wafers generally having diameters from about 3 inches to about 18 inches, during each application solution can be delivered in quantities from about 0.05 milliliter (mL) to about 50 mL, in further embodiments from about 0.075 mL to about 40 mL, and in other embodiments form about 0.1 mL to about 25 mL. In some embodiments, the solution can be sprayed at a flow rate from about 5 mL/min to about 50 mL/min, and the solution can be applied for from about 1 second to about 5 minutes and in further embodiments from about 5 seconds to about 2 minutes. A person of ordinary skill in the art will recognize that additional ranges of solution application numbers and volumes within the explicit ranges above are contemplated and are within the present disclosure.

An apparatus to perform edge bead removal is shown in FIG. 1. Referring to FIG. 1, a wafer processing apparatus 100 comprises a spindle 102 with a hollow core 104 connected to a motor to rotate the spindle and a pump configured to apply negative pressure to the hollow core of the spindle, a chuck 106 operably connected to the spindle to rotate with the spindle, and a fluid dispenser 108 configured to dispense fluid 110 to the edge of one or both surfaces of a wafer supported on chuck 106 and held in place by negative pressure within hollow core 104. A wafer 112 is shown in FIG. 1 appropriately positioned in the apparatus. Fluid dispenser 108 can comprise a nozzle or the like to direct fluid to the wafer. A reservoir 114 is operably connected to fluid dispenser 108 to provide the fluid. Reservoir can be a suitable container for holding the fluid connected with a tubing, a hose, or the like, and gravity or a pump or the like can be used to drive the fluid transfer from reservoir 114. Negative pressure applied to hollow core 104 can be provided by a negative pressure device 116, which can be a pump, aspirator, blower or the like. Spindle 102 can also be connected to a motor 118, which can have an appropriate design and fittings, to spin spindle 102 for wafer processing. A specific equipment design for edge bead processing is described in U.S. Pat. No. 8,826,926 B2 to Chalom et al., entitled "Methods of Profiling Edges and Removing Edge Beads," incorporated herein by reference.

Figure 2:
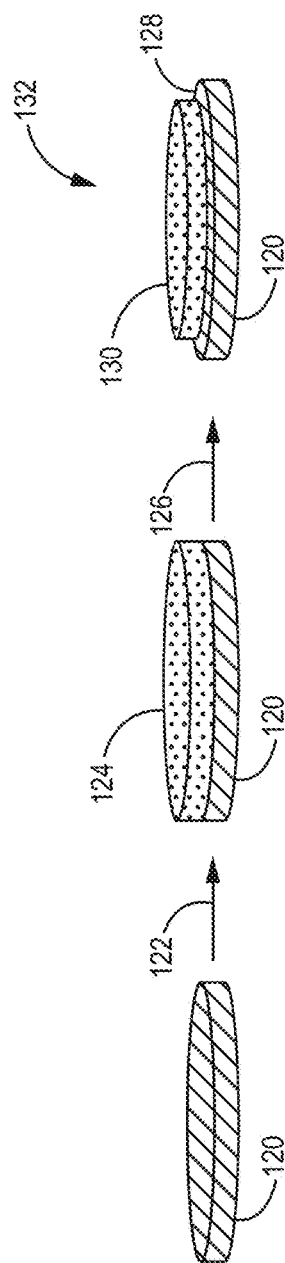
FIG. 2 is a schematic diagram depositing steps to prepare a wafer with a resist layer following an edge bead rinse with two processing steps shown.

The edge bead rinse process is schematically shown in FIG. 2. As shown in the left image, substrate 120 is obtained and is coated 122 with metal-based resist 124. Then, a bead edge rinse step 126 is performed to remove resist along edge 128 of substrate 120 to form edged resist layer 130. The edge bead rinse process is described further above in terms of compositions, quantities of compositions and delivery apparatuses. The resulting structure 132 with edged resist layer 130 can then be used to a patterning step for substrate 120. The coating of the wafer with a resist, for example, can be performed by depositing from about 0.25 mL to about 20 mL of resist solution onto a stationary wafer in an appropriate configuration, and then spinning the wafer to spread the resist, for example, from 250 rpm to 10,000 rpm for a time from about 5 seconds (s) to about 15 minutes (mins). Spin speed can be varied over the spin time if desired. A person of ordinary skill in the art will recognize that additional ranges of fluid quantities, spin rates and spin times within the explicit ranges above are contemplated and are within the present disclosure.

To perform a rinse step, the wafer generally can be spun at a low to moderate rate during the fluid deposition and then spun at a greater rate following fluid deposition. The edge bead rinse solution can be applied to the edge as well as the back of the wafer. For example, the wafer can be spun during fluid deposition at from 5 rpm to 10,000 rpm and in further embodiments from 50 rpm to 5000 rpm. The liquid deposition process can be performed from 1 second to 5 minutes and in further embodiments from about 5 seconds to about 3 minutes. Following liquid deposition, the wafer can be spun at a rate of at least 500 rpm and in further embodiments from 750 rpm to 6000 rpm, and the post liquid deposition spin can be performed for from 2 seconds to 10 minutes and in further embodiments from 5 seconds to about 5 minutes. Spin speed can be varied over the spin time if desired. A person or ordinary skill in the art will recognize that additional ranges of spin speed and spin times within the explicit ranges above are contemplated and are within the present disclosure. Following the post deposition spin, a subsequent rinse step can be performed, and this processing can be repeated as selected.

Figure 3:
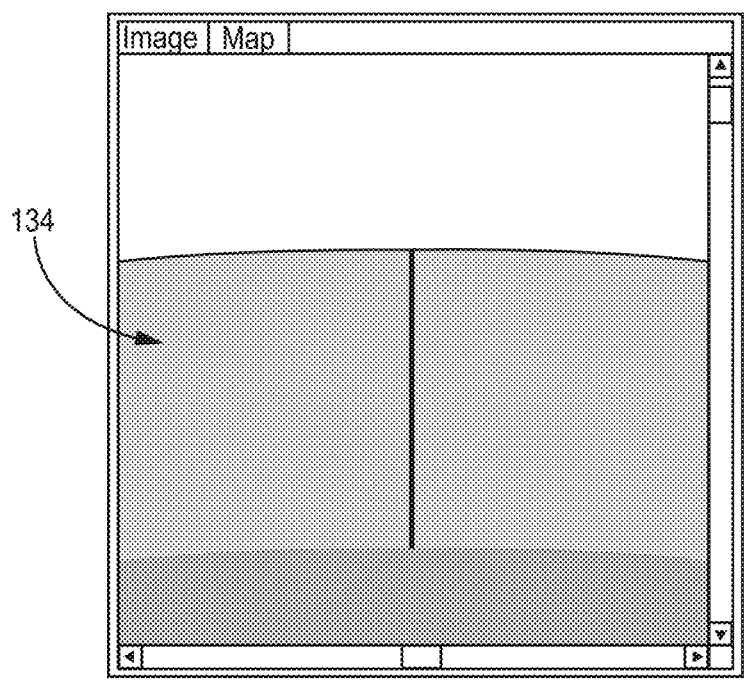
FIG. 3 is a photograph of a microscope image depicting a wafer edge following an edge bead rinse.

Following application of an edge bead solution to remove the edge bead, the edge of a wafer can look visibly clean to inspection as shown in FIG. 3 with a clean edge 134. As described above, the edge bead rinse processes can comprise a plurality of rinsing steps with the same and/or distinct rinsing solutions to achieve the desired results. To fully evaluate the removal of metal, the wafer can be examined for residual metal. A suitable approach available commercially for the evaluation of trace metals generally involves Inductively Coupled Plasma Mass Spectrometry (ICP-MS). For evaluation of a silicon wafer surface, a variation of this analytical technique termed Vapor Phase Decomposition-Inductively Coupled Plasma Mass Spectrometry (VPD-ICP-MS) can be used. Using this technique, the residual metal can be determined per unit area of the wafer surface along the edge. For the tin based resists described in the example, it is desirable to obtain residual tin in amounts of no more than about $100 \times 10^{10}$ atoms/cm$^2$ of wafer area, in further embodiments no more than about $25 \times 10^{10}$ atoms/cm$^2$, and in additional embodiments no more than about $10 \times 10^{10}$ atoms/cm$^2$ based on wafer area in the rinsed region. A person of ordinary skill in the art will recognize that additional ranges of residual tin within the explicit ranges above are contemplated and are within the present disclosure.

In addition to the use of improved EBR solutions as described above, a coating along the substrate edge or across the whole substrate can be applied to further facilitate the reduction of residual metal along the wafer edge after an EBR process. Such coatings are generally insoluble in the photoresist coating solution and may or may not be completely or substantially removed as part of subsequent EBR processes. After the coatings are applied, the resist solution can be deposited that may or may not cover the coatings, as described further below. In some embodiments, suitable coatings can be a sacrificial material, such as polystyrene or amorphous carbon, that may or may not cover the entire substrate and may or may not be selectively removed with the resist coating during subsequent EBR processing. If the coating covers the entire wafer, the remaining coating, such as in the case of amorphous carbon, can be used as a differentially etchable layer in the patterning stack. In other embodiments, a suitable polymer coating, such as polystyrene, can be coated along only the periphery of a wafer and can be removed at least in part in subsequent EBR processing. In this case, the coating can be removed with the EBR processing of the resist material or it can alternately be removed by a separate EBR process. In other embodiments, suitable coatings, such as a surface modifying layer or an anti-adherence coating, can cover only the peripheral edge of a wafer to prevent the resist solution from adhering to the surface of the coating during resist deposition, and may or may not be removed in subsequent EBR processing.

Thus, improved processing can pertain to coating the edge surface region or entire surface of the wafer with a secondary sacrificial material prior to coating the metal-based resist. In additional or alternative embodiments, improved processing can comprise coating the wafer edge surface region with a surface treatment layer which prevents wetting of the edge surface region with resist precursor solution. Generally, neither a sacrificial layer nor an anti-adhesion layer require a baking step prior to resist coating and EBR, providing for a desirable process flow. Without wanting to be limited by theory, it is presumed that anti-adhesion materials and processes inhibit adhesion of metal-containing species to the substrate surface, thus facilitating more complete removal of the photoresist with reduced metal residue when appropriate EBR solvents or mixtures are applied. Improved rinse solutions described herein have proven particularly effective at removing residual tin atoms, and may be used as a stand-alone EBR solution, or in combination with the sacrificial or surface treatment layers described herein. As illustrated by the materials and methods in the Examples, residual tin levels after an EBR process can be reduced to acceptable levels using the methods described herein.

The selection of compositions for a sacrificial material can be influence by whether or not the coating covers the entire substrate/wafer of just the edge. In general, the sacrificial material may or may not be fully removed during the bead edge rinse as long as the presence of the sacrificial material favors removal of metal ions from along the bead edge. If the sacrificial layer covers the wafer, a sacrificial layer may also be removable when corresponding resist is removed with or without irradiation. Specifically, the sacrificial material can be selected for removal using the developer for the resist. Additionally or alternatively, a sacrificial layer such as an amorphous carbon layer or a spin-on carbon layer can be removed during an etch step on the wafer/substrate material. Spin-on-carbon material is available commercially from JSR Corp. (Japan). See also, for example, U.S. Pat. No. 9,102,129B2 to Krishnamurthy et al., entitled "Spin-on Carbon Compositions for Lithographic Processing," incorporated herein by reference. The spin on carbon materials can be coated using an appropriate coating process and can be dried for example with heating. CVD carbon layer deposition is described, for example, in published U.S. patent application 2007/0037014 to Nagata, entitled "Method of Forming a Protective Film and a Magnetic Recording Medium Having a Protective Film Formed by the Method," incorporated herein by reference. A sacrificial coating that modifies the surface edge of the substrate in the absence of heating or other post-processing are described that allow for removal of tin based resists along with the edge portion of the protective coating during an EBR process. A specific example is described below using polystyrene as an edge coating for use with the tin based resist.

Figure 4:
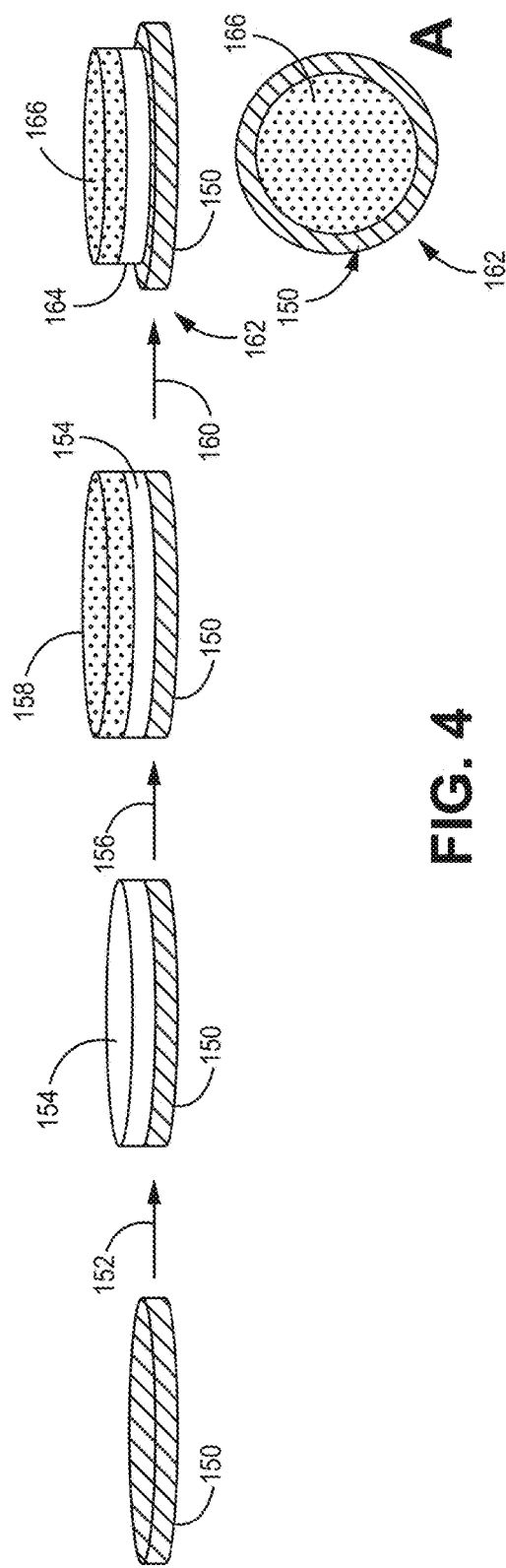
FIG. 4 is a schematic diagram depicting steps used to form a sacrificial layer over a substrate that is then used to facilitate edge bead removal in a rinse step, in which insert A shows a top view of the final rinsed wafer.

Processing to cover a substrate with a sacrificial material over the entire substrate is outlined in FIG. 4. After a substrate 150 is obtained, a layer of sacrificial material is applied 152 over substrate 150 to form sacrificial layer 154. Application of sacrificial layer 154 can be performed using an appropriate coating solution as described above using spin coating, spray coating, knife edge coating, chemical vapor deposition (CVD), for example, for the deposition of amorphous carbon, or other suitable coating technique, or combinations thereof. Then, a resist precursor solution can be deposited 156 to form a resist layer 158. Resist precursor solutions are generally applied by spin coating, but spray coating or other coating processes can be used. After forming resist layer 158, an edge bead rinse step 160 can be performed to form edged structure 162 with an edged sacrificial layer 164 and an edged resist layer 166. The edge bead rinse process is described further above and can be similarly employed in the context of the processing in FIG. 4. A top view of edged structure 162 is shown in insert A of FIG. 4.

The processing to cover the substrate with a sacrificial material can follow the procedure used to deposit a resist. The precursor solution for the sacrificial material can be deposited on a stationary wafer at appropriate coverage. Then, the wafer can be spun to distribute the fluid over the wafer surface. A quantity of fluid can be selected based on the concentration, fluid properties, such as viscosity, desired thickness of the dried sacrificial material, and other relevant parameters with adjustment based on empirical evaluation. Generally, the quantity of fluid can be from about 0.1 mL to about 100 mL and in further embodiments from about 0.25 mL to about 25 mL. After deposition of the fluid, to spread the fluid the wafer can be spun to distribute the fluid over the wafer, in which the wafer can be spun at from 250 rpm to 10,000 rpm and in further embodiments from 450 rpm to 6000 rpm for a time from 2 s to 10 mins and in further embodiments from 5 s to 5 mins. Spin speed can be varied over the spin time if desired. To achieve desired coating, a plurality of deposition and spin steps can be used if desired. A person of ordinary skill in the art will recognize that additional ranges of fluid quantities, spin speeds and spin times within the explicit ranges above are contemplated and are within the present disclosure.

Figure 5:
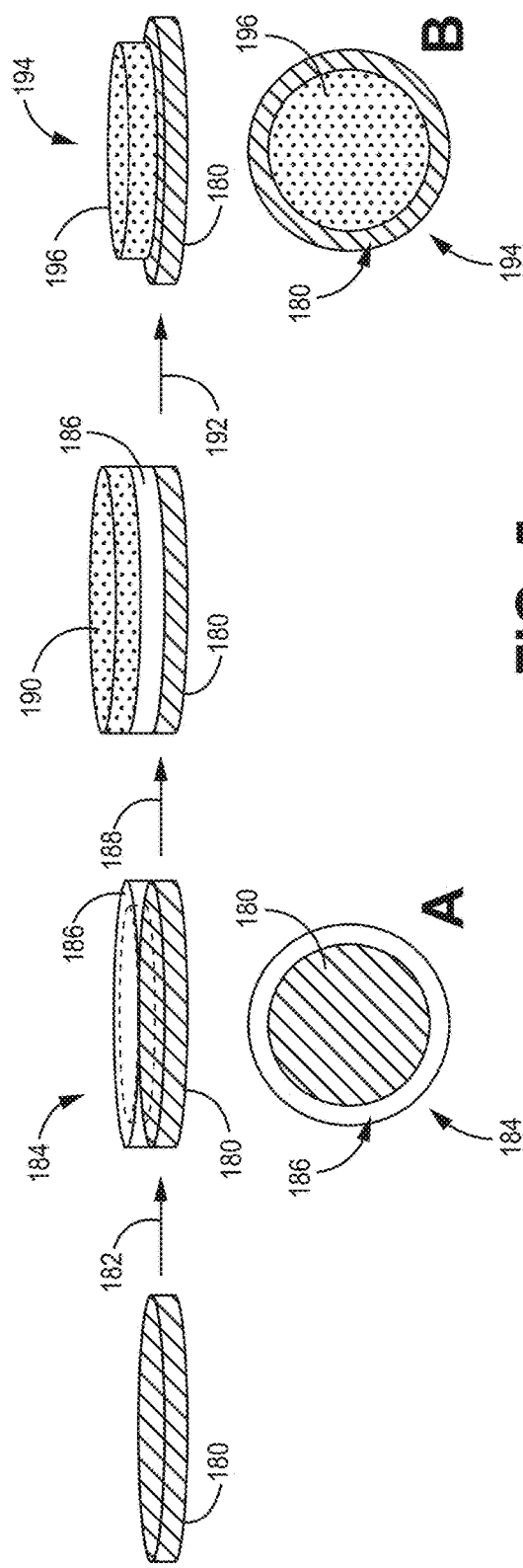
FIG. 5 is a schematic diagram depicting steps used to form a sacrificial edge coating or sacrificial ring over a substrate that facilitates edge bead removal, in which insert A is a top view of the wafer with the sacrificial ring and insert B depicts the final bead edge rinsed structure.

The use of a sacrificial layer along an edge is depicted schematically in FIG. 5. After obtaining a substrate 180, sacrificial layer coating material can be applied 182 along the edge of substrate 180 to form edge protected structure 184 with sacrificial ring 186 on substrate 180. Application of the sacrificial layer coating material can be performed along the edge, for example, using a bead rinse device modified to deliver the coating material along the edge. During the delivery of the coating material, the substrate can be spun at a rate that is consistent with maintenance of at least a significant fraction of the coating material along the edge. A top view of edge protected structure 184 is shown in insert A of FIG. 5. Then, a resist solution can be deposited 188 over edge protected structure 184 to form resist layer 190. Edge bead rinse process 192 then removes both sacrificial ring 186 and the resist material along the edge to form edged structure 194 with edged resist layer 196 on substrate 180. The edge bead rinse process is described further above and can be similarly employed in the context of the processing in FIG. 5. A top view of edged structure 194 is shown in FIG. 5.

An alternative approach to provide a clean bead edge involves applying an edge coating surface treatment that inhibits surface build-up of resist along the edge. In particular, an edge coating composition can be applied that has a critical surface tension that is below the surface tension of the resist coating composition. The critical surface tension (CST) is a property of a solid surface. Most inorganic solids, such as a surface of a silicon wafer, are hard and have a correspondingly high critical surface tension. Therefore, most liquids wet a silicon wafer. Coatings can be applied that have a lower surface tension, such as silanes or fluorinated compounds, as a surface treatment that functions as an anti-adhesion coating along the wafer edge. An anti-adhesion coating can be applied over the wafer edge prior to application of the resist. When the resist is applied, the resist substantially does not stick along the edge. A bead edge rinse then is performed following the application of the resist to remove any minor amounts of resist that may have remained along the edge. After the bead edge rinse, processing is continued as usual. Since the edge is not patterned, the anti-adhesion coating along the edge does not need to be removed or to be processable during patterning processes for the wafer.

Suitable anti-adhesion compositions include, for example, fluorinated vinyl polymers, such as polytetrafluoroethylene and copolymers thereof. The fluoropolymers may or may not be fully fluorinated, i.e. perfluoro-polymers. Alkyl halogenated silanes can also be useful to supply a lower critical surface tension anti-adhesion surface. Suitable silanes include, for example, alkyltrichlorosilanes, such as heneicosafluorododecyltrichlorosilane (CST≈6-7 dynes/cm at 25° C.), heptadecylfluorodecyltrichlorosilane (CST≈12 dynes/cm at 25° C.), octadecyltrichloro silane (CST≈20-24 dynes/cm at 25° C.). For resists with somewhat higher surface tensions, alkyltrialkoxysilanes can also provide sufficient anti-adhesion properties. Suitable alkyltrialkoxysilanes include, for example, methyltrimethoxysilane (CST≈22.5 dynes/cm at 25° C.), nonafluorohexyltrimethoxysilanes (CST≈23 dynes/cm at 25° C.), or mixtures thereof. An exemplified alkyltin oxyhydroxy based resist exemplified herein had a surface tension of about 23 dynes/cm at 25° C. The selection of the anti-adhesion coating materials generally can be influenced by the composition of the resist, but the coating compositions generally have a critical surface tension at 25° C. of no more than about 50 dynes/cm, in further embodiments no more than about 30 dynes/cm and in further embodiments no more than about 22 dynes/cm. A person of ordinary skill in the art will recognize that additional ranges of critical surface tension within the explicit ranges above are contemplated and are within the present disclosure.

The fluoropolymers can be dispensed, for example, as a dispersion of polymer microparticles. The dispersant liquid can be a fluorinated alkane, such as perfluorohexane, perfluorooctane, or the like, or mixtures thereof. The silanes can be dispensed in a suitable solvent, such as methylene chloride, tetrahydrofuran (THF), toluene, or other suitable organic solvents or mixtures thereof.

Figure 6:
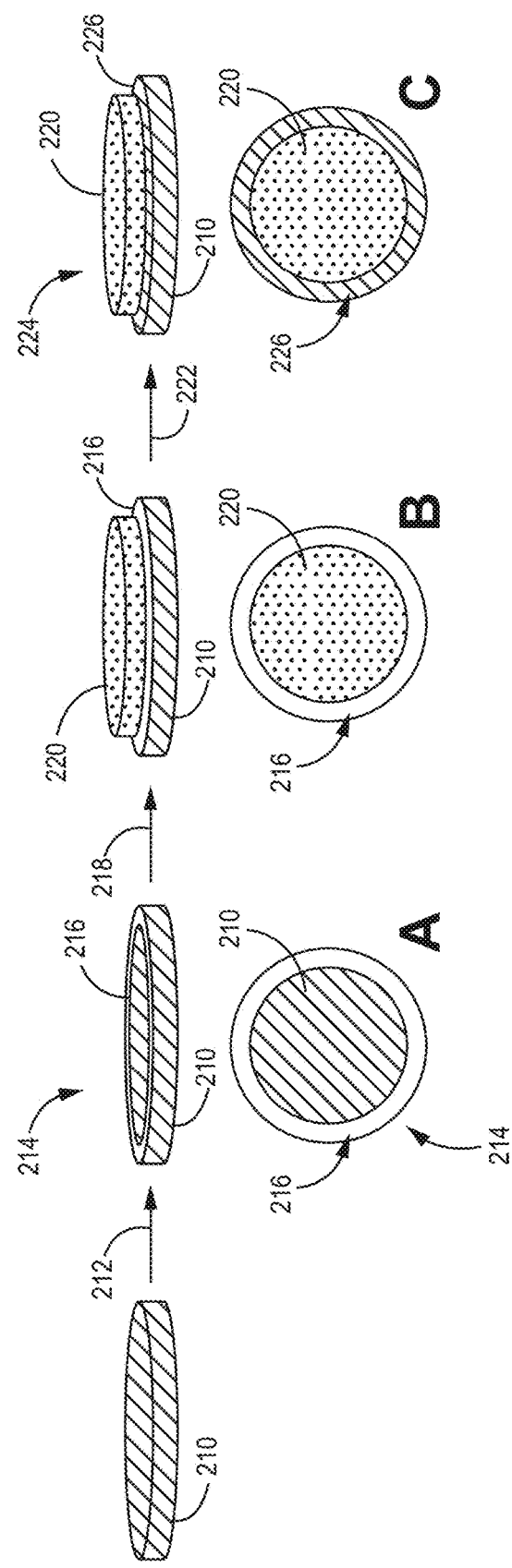
FIG. 6 is a schematic diagram depicting processing with an anti-adhesion edge coating to provide for substantial avoidance of resist deposition along the edge and with a bead edge rinse to further reduce any residual metal contamination along the edge following processing, in which insert A depicts a top view of the wafer with the anti-adhesion edge coating, insert B depicts a top view of the structure following resist deposition, and insert C is a top view of the structure following an edge bead rinse.

The application of an anti-adhesion coating along the substrate edge is shown schematically in FIG. 6. After obtaining a substrate 210, a solution of surface modifying material is applied 212 to form edge protected structure 214 with an anti-adhesion edge coating 216 along substrate 210. Application of surface modifying material to form anti-adhesion edge coating 216 can be performed, for example, with an edge bead rinse apparatus modified to deliver the material under suitable conditions to allow a significant amount of the coating material to remain on the substrate edge. A top view of edge protected structure 214 is shown in insert A of FIG. 6. Then, resist precursor solution is deposited 218 onto edge protected structure 214 to form an edged resist layer 220. Application of resist precursor solution can be performed using spin coating, spray coating or other suitable technique(s). A top view of the structure with edged resist layer 220 is shown in insert B of FIG. 6. An edge bead rinse is then performed 222 to remove any residual resist along the edge, and optionally also remove all or a portion of anti-adhesion edge coating 216, to form rinsed structure 224 with rinsed edge 226 which may or may not include residual anti-adhesion edge coating. The edge bead rinse is performed as described above. A top view of rinsed structure 224 is shown in insert C of FIG. 6.

With respect to the application of a sacrificial coating along the wafer edge as outlined in FIG. 5 or the application of a surface modifying composition as outlined in FIG. 6, the wafer generally can be spun at a low to moderate rate during the fluid deposition and then spun at a greater rate following fluid deposition. For example, the wafer can be spun during fluid deposition at from 5 rpm to 500 rpm and in further embodiments from 10 rpm to 250 rpm. The liquid deposition process can be performed from 5 seconds to 5 minutes and in further embodiments from about 15 seconds to about 3 minutes. Following liquid deposition, the wafer can be spun at a rate of at least 500 rpm and in further embodiments from 750 rpm to 4000 rpm, and the post liquid deposition spin can be performed for from 5 seconds to 10 minutes and in further embodiments from 10 seconds to about 5 minutes. Spin speed can be varied over the spin time if desired. A person or ordinary skill in the art will recognize that additional ranges of spin speed and spin times within the explicit ranges above are contemplated and are within the present disclosure. Following the post deposition spin, a subsequent rinse step can be performed, and this processing can be repeated as selected.

Generally, with respect to surface modification coatings (e.g., sacrificial coatings or anti-adhesion coatings) either along the edge or over the wafer surface, a coating following drying can be in some embodiments no more than about 10 microns thick, in some embodiments no more than about 5 microns thick and in further embodiments no more than about 1 microns thick. In additional or alternative embodiments, a thinner coating can be desirable for example from about 1 nm to about 500 nm, in further embodiments from about 5 nm to about 250 nm, and in other embodiments from about 7 nm to about 100 nm. A person of ordinary skill in the art will recognize that additional ranges within the explicit thickness ranges above are contemplated and are within the present disclosure. The concentrations and wet coating thicknesses can both be adjusted to achieve desired thickness of the coatings.

In all embodiments, those skilled in the art will recognize that the identity of the substrate is not limited except by reasonable constraints recognized by those of ordinary skill in the art, such as a size that is compatible with process equipment and sufficient mechanical strength to tolerate processing. Suitable substrate surfaces can comprise silicon, such as single crystalline silicon, polycrystalline silicon, amorphous silicon, or the like, ceramics, such as silicon oxide, titanium oxide or the like, or other suitable materials or combinations thereof. The substrate surface may or may not be already patterned prior to initiation of the further patterning process of which the EBR processing is a part of the specific patterning step.

EXAMPLES

Example 1

Selected EBR Solvents and Carboxylic Acid Additives

This example demonstrates the effectiveness of organic solvents with carboxylic acid additives for performing effective residue removal with tin based radiation patternable resists.

Experiments were performed with two different radiation patternable resists. R1 resist comprised organometallic tin oxyhydroxide resist with a mixture of two distinct alkyl ligands, and R2 resist comprised a mixture of an organometallic tin oxyhydroxide resist with an alkyl ligand and a tin oxyhydroxide composition without alkyl ligands. The resists were deposited via spin coating onto single crystal silicon wafers. Immediately following the deposition of the resist, the wafer was set to rotate at 50 rpm while 5 mL of a rinse solution was dispensed onto the wafer so as to cover its entire surface. Immediately after dispensing of the rinse solution, the wafer was spun at 1500 rpm for 45 seconds until dry. In some cases, as indicated in Table 1, a second distinct rinse solution was dispensed onto the wafer subsequent to spin drying of the first rinse solution, and was processed in an identical manner, i.e., dispensed onto the wafer while rotating at 50 rpm, followed by spinning at 1500 rpm for 45 seconds to dry. If appropriate, immediately after this higher speed spin, a next volume of rinse solution was dispensed and the procedure was repeated as above, typically 5 times, until after the higher speed spin following the final rinse solution application. It is believed that the residue removal evaluated in these tests will approximate the effectiveness of an edge bead rinse process in which only the wafer edge is rinsed.

Measurements of residual metal was performed by ChemTrace®, using Vapor Phase Decomposition-Inductively Coupled Plasma-Mass Spectrometry (VPD-ICP-MS) of the bevel edge. Results in Tables 1 and 2 were obtained with resist R1, and results in Table 3 were obtained with resist R2. To obtain the results in Table 1, a total of 5 rinse steps were performed with 5 ml per rinse step and a drying spin between each rinse step. In Tables 2 and 3 "n×a mL", such as 4×3 mL, indicate multiple rinse steps of a specified volume with the same solution, so 4×3 mL would indicate 4 rinse steps each using 3 mL of solution. Table 4 provides a list of solvents and additives used in the previous Tables. As the results show, R2 provide a more significant challenge with respect to desired removal of tin, but desirable results were obtained with suitable rinse solutions. However, for both resist, rinse solutions with additives were successful in reducing

TABLE 1

| Wafer | 1- or 2-stage EBR strip? | Strip Process Description | VDP-ICP Result Sn (E10 atom/cm$^2$) |
|---|---|---|---|
| 1 | n/a | (Blank wafer for control) | 9.1 |
| 2 | 1 | Solvent 1 | 3600 |
| 3 | 1 | Solvent 2 | 3100 |
| 4 | 1 | Solvent 3 | 1400 |
| 5 | 2 | 1) Solvent 1, 2) Solvent 2 | 3200 |
| 6 | 1 | Solvent 1 + Additive 1 | 270 |
| 7 | 2 | 1) Solvent 1, 2) Solvent 2 + Additive 1 | 540 |
| 8 | 1 | Solvent 2 + Additive 1 | 620 |
| 9 | 2 | 1) Solvent 1, 2) Solvent 2 + Additive 2 | 120 |
| 10 | 1 | Solvent 3 + Additive 3 | 19 |
| 11 | 2 | 1) Solvent 1, 2) Solvent 3 | 850 |
| 12 | 2 | 1) Solvent 1, 2) Solvent 3 + Additive 3 | 8.9 |

TABLE 2

| Wafer | 1- or 2-stage EBR strip? | Strip Process Description | VDP-ICP Result Sn (E10 atom/cm$^2$) |
|---|---|---|---|
| 13 | 1 | (4 × 3 mL) Solvent 1 | 527 |
| 14 | 1 | (4 × 3 mL) Solvent 2 + 5 wt % Additive 1 | 24 |
| 15 | 1 | (5 × 5 mL) Solvent 2 + 5 wt % Additive 1 | 8.6 |
| 16 | 2 | (5 × 5 mL) 1) Solvent 1, (4 × 5 mL) 2) Solvent 2 + 5 wt % Additive 2 | 0.27 |
| 17 | 2 | (5 × 5 mL) 1) Solvent 1, (4 × 5 mL) 2) Solvent 2 + 5 wt % Additive 4 | 9.4 |
| 18 | 2 | (5 × 5 mL) 1) Solvent 1, (4 × 5 mL) 2) Solvent 2 + 2 wt % Additive 5 | 15 |
| 19 | 2 | (5 × 5 mL) 1) Solvent 2, (4 × 5 mL) 2) Solvent 1 + 2 wt % Additive 6 | 6.3 |
| 20 | 2 | (5 × 5 mL) 1) Solvent 1, (4 × 5 mL) 2) Solvent 2 + 5 wt % Additive 4 | 7.8 |
| 21 | 2 | (5 × 5 mL) 1) Solvent 1, (4 × 5 mL) 2) Solvent 2 + 2 wt % Additive 5 | 17 |
| 22 | 1 | (10 × 5 mL) Solvent 2 + 5 wt % Additive 1 | 18 |
| 23 | 1 | (5 × 5 mL) Solvent 3 | 70 |
| 24 | 2 | (5 × 5 mL) 1) Solvent 3, (4 × 5 mL) 2) Solvent 2 + 5 wt % Additive 1 | 12 |
| 25 | 2 | (5 × 5 mL) 1) Solvent 3, (4 × 5 mL) 2) Solvent 2 + 5 wt % Additive 2 | ND |
| 26 | 1 | (5 × 5 mL) Solvent 3 + 5 wt % Additive 1 | 18 |
| 27 | 1 | (5 × 5 mL) Solvent 2 + 2.5 wt % Additive 1 + 2.5 wt % Additive 2 | 32 |
| 28 | 1 | (5 × 5 mL) Solvent 2 + 1.5 wt % Additive 1 + 1.5 wt % Additive 2 + 1.5 wt % Additive 6 | 18 |
| 29 | 1 | (5 × 5 mL) Solvent 2 + 2.5 wt % Additive 1 + 2.5 wt % Additive 6 | 33 |
| 30 | 2 | (5 × 5 mL) 1) Solvent 2 + 2.5 wt % Additive 1 + 2.5 wt % Additive 6, (1 × 5 mL) 2) Solvent 3 | 30 |
| 31 | 1 | (5 × 5 mL) Solvent 3 + 5 wt % Additive 3 | ND |
| 32 | 1 | (5 × 5 mL) Solvent 3 + 1 wt % Additive 2 | 17 |
| 33 | 1 | (5 × 5 mL) Solvent 3 + 3.5 wt % Additive 3 | 22 |
| 34 | 1 | (5 × 5 mL) Solvent 3 + 5 wt % Additive 3 | 4 |

TABLE 3

| Wafer | 1- or 2-stage EBR strip? | Strip Process Description | VDP-ICP Result Sn (E10 atom/cm$^2$) |
|---|---|---|---|
| 35 | 1 | (5 × 5 mL) Solvent 1 + 5 wt % Additive 3 | 15 |
| 36 | 1 | (5 × 5 mL) Solvent 3 | 15000 |
| 37 | 1 | (5 × 5 mL) Solvent 1 | 18000 |
| 38 | 1 | (5 × 5 mL) Solvent 1 + 05. wt % Additive 3 | 179 |
| 39 | 1 | (5 × 5 mL) Solvent 4 + 5 wt % Additive 1 | 3200 |
| 40 | 1 | (5 × 5 mL) Solvent 4 | 17000 |
| 41 | 1 | (5 × 5 mL) Solvent 1 + 10 wt % Additive 1 | 1700 |
| 42 | 1 | Solvent 1 | 21000 |
| 43 | 2 | (5 × 5 mL) 1) Solvent 3 + 5 wt % Additive 3, (1 × 5 mL) 2) Solvent 3 | 460 |
| 44 | 1 | Solvent 3 | 7700 |
| 45 | 2 | (5 × 5 mL) 1) 1) 78 wt % solvent 6 + 10 wt % solvent 5 + 10 wt % Additive 3 + 2 wt % Additive 7, (1 × 5 mL) 2) Solvent 1 | 35 |
| 46 | 2 | (5 × 5 mL) 1) 1) 78 wt % solvent 6 + 10 wt % solvent 5 + 10 wt % Additive 3 + 2 wt % Additive 7, (1 × 5 mL) 2) Solvent 1 | 58 |
| 47 | 2 | (5 × 5 mL) 1) 1) 78 wt % solvent 6 + 10 wt % solvent 5 + 10 wt % Additive 3 + 2 wt % Additive 7, (1 × 5 mL) 2) Solvent 1 | 33 |
| 48 | 1 | (1 × 5 mL) 80 wt % Solvent 6 + 10 wt % Solvent 5 + 5 wt % Additive 3 + 5 wt % Additive 8 | 160 |
| 49 | 1 | (1 × 5 mL) 75 wt % Solvent 6 + 10 wt % Solvent 5 + 10 wt % Additive 9 + 5 wt % Additive 3 | 170 |
| 50 | 1 | (1 × 5 mL) 85 wt % Solvent 7 + 10 wt % Additive 9 + 5 wt % Additive 3 | 150 |
| 51 | 1 | (1 × 5 mL) 80 wt % Solvent 7 + 10 wt % Additive 9 + 10 wt % Additive 3 | 79 |
| 52 | 1 | (1 × 5 mL) 95 wt % Solvent 7 + 5 wt % Additive 3 | 97 |
| 53 | 1 | (1 × 5 mL) 85 wt % Solvent 6 + 10 wt % Solvent 5 + 5 wt % Additive 3 | 95 |

TABLE 3-continued

| Wafer | 1- or 2-stage EBR strip? | Strip Process Description | VDP-ICP Result Sn (E10 atom/cm$^2$) |
|---|---|---|---|
| 54 | 1 | (1 × 5 mL) 83 wt % Solvent 6 + 10 wt % Solvent 5 + 5 wt % Additive 3 + 2 wt % Additive 7 | 54 |
| 55 | 1 | (1 × 5 mL) 83 wt % Solvent 6 + 10 wt % Solvent 5 + 5 wt % Additive 3 + 2 wt % Additive 10 | 86 |
| 56 | 1 | (1 × 5 mL) 88 wt % Solvent 6 + 10 wt % Solvent 5 + 2 wt % Additive 7 | 630 |
| 57 | 1 | (1 × 5 mL) 88 wt % Solvent 6 + 10 wt % Solvent 5 + 2 wt % Additive 10 | 3200 |
| 58 | 1 | (1 × 5 mL) Solvent 8 + 0.5 wt % Additive 3 | 2100 |
| 59 | 1 | (1 × 5 mL) Solvent 8 + 1 wt % Additive 3 | 260 |
| 60 | 1 | (1 × 5 mL) Solvent 8 + 5 wt % Additive 3 | 43 |
| 61 | 1 | (1 × 5 mL) Solvent 8 + 10 wt % Additive 3 | 22 |
| 62 | 1 | (1 × 5 mL) Solvent 8 + 20 wt % Additive 3 | 51 |
| 63 | 1 | (1 × 5 mL) 85 wt % Solvent 6 + 10 wt % Solvent 5 + 5 wt % Additive 11 | 480 |
| 64 | 1 | (1 × 5 mL) 85 wt % Solvent 6 + 10 wt % Solvent 5 + 5 wt % Additive 8 | 99 |
| 65 | 1 | (1 × 5 mL) Solvent 5 + 85 wt % Additive 9 | 300 |
| 66 | 1 | (1 × 5 mL) 50 wt % Solvent 6 + 50 wt % Additive 9 | 300 |

TABLE 4

| Chemical Name: | Composition |
|---|---|
| Solvent 1 | 70/30 by volume % PGME/PGMEA mix |
| Solvent 2 | Isopropyl alcohol |
| Solvent 3 | 2-heptanone |
| Solvent 4 | n-butyl acetate |
| Solvent 5 | water |
| Solvent 6 | PGME |
| Solvent 7 | propylene carbonate |
| Solvent 8 | 65/35 by volume % PGME/PGMEA mix |
| Additive 1 | Acetic acid |
| Additive 2 | Citric acid |
| Additive 3 | Oxalic acid |
| Additive 4 | 2-nitrophenylacetic acid |
| Additive 5 | Dodecanoic acid |
| Additive 6 | 2-ethylhexanoic acid |
| Additive 7 | ethylhexylphosphate |
| Additive 8 | dihydroxyfumaric acid |
| Additive 9 | lactic acid |
| Additive 10 | triton-x |
| Additive 11 | cyanoacetic acid |

Example 2

Selected EBR Solvents and Fluorinated Acid Additives

This example demonstrates the effectiveness of organic solvents with fluorinated acid additives for performing effective bead edge rinsing with tin based radiation patternable resists.

These experiments were performed using the tin based resist R1 and resist R2 noted in Example 1. The testing was performed as described in Example 1 with substitution of the fluorinated additives. All of the testing in this example was performed with one 5 mL EBR rinse stage followed by 5×5 mL rinses with PGME/PGMEA solvent blend. The results obtained with R1 are presented in Table 5 and with R2 in Table 6. The notation N in the table represents equivalents per liter using standard notation. These additives were particularly effective for the R2 resist. The solvents and additives for this Example are presented in Table 7.

TABLE 5

| Wafer | Strip Process Description | VDP-ICP Result Sn (E10 atom/cm2) |
|---|---|---|
| 67 | 88 wt % Solvent 6 + 9 wt % Solvent 5 + 3 wt % Additive 12 (Control-No resist) | 45 |
| 68 | Solvent 8 | 16000 |
| 69 | 83 wt % Solvent 10 + 17 wt % Additive 13 | 17 |
| 70 | 74 wt % Solvent 6 + 17 wt % Solvent 5 + 9 wt % Additive 14 | 83 |
| 71 | 68 wt % Solvent 11 + 24 wt % Solvent 5 + 8 wt % Additive 15 | 30 |
| 72 | 96 wt % Solvent 6 + 3 wt % Solvent 5 + 1 wt % Additive 15 | 13 |
| 73 | 5 wt % Additive 16 + 95 wt % Solvent 6 with (w/) 2N Additive 16 | 28 |

TABLE 6

| Wafer | Strip Process Description | VDP-ICP Result Sn (E10 atom/cm2) |
|---|---|---|
| 74 | 60 wt % Solvent 6 + 30 wt % Solvent 5 + 10 wt % Additive 15 | 0.77 |
| 75 | 60 wt % Solvent 6 + 30 wt % Solvent 5 + 10 wt % Additive 15 | 6.3 |
| 76 | 60 wt % Solvent 6 + 30 wt % Solvent 5 + 10 wt % Additive 15 | 8.1 |
| 77 | 60 wt % Solvent 6 + 30 wt % Solvent 5 + 10 wt % Additive 15 | 1.3 |
| 78 | 80 wt % Solvent 6 + 15 wt % Solvent 5 + 5 wt % Additive 15 | 14 |
| 79 | 80 wt % Solvent 6 w/1N Additive 17 + 15 wt % Solvent 5 + 5 wt % Additive 15 | 2.8 |
| 80 | 80 wt % Solvent 6 w/0.25N Additive 18 + 15 wt % Solvent 5 + 5 wt % Additive 15 | 8.8 |
| 81 | 80 wt % Solvent 6 w/0.5N Additive 18 + 15 wt % Solvent 5 + 5 wt % Additive 15 | 19 |
| 82 | 80 wt % Solvent 6 w/1N Additive 18 + 15 wt % Solvent 5 + 5 wt % Additive 15 | 20 |
| 83 | 80 wt % Solvent 6 w/1N Additive 19 + 15 wt % Solvent 5 + 5 wt % Additive 15 | 3.2 |
| 84 | 80 wt % Solvent 6 w/0.5N Additive 16 + 15 wt % Solvent 5 + 5 wt % Additive 15 | 6.3 |
| 85 | 80 wt % Solvent 6 w/1N Additive 16 + 15 wt % Solvent 5 + 5 wt % Additive 15 | 2.5 |

TABLE 6-continued

| Wafer | Strip Process Description | VDP-ICP Result Sn (E10 atom/cm2) |
|---|---|---|
| 86 | 80 wt % Solvent 6 w/2N Additive 16 + 15 wt % Solvent 5 + 5 wt % Additive 15 | 8 |

TABLE 7

| Chemical Name: | Composition |
|---|---|
| Solvent 5 | water |
| Solvent 6 | PGME |
| Solvent 10 | PGMEA |
| Solvent 11 | propylene glycol |
| Additive 12 | tetramethylammonium fluoride |
| Additive 13 | triethylamine•3HF |
| Additive 14 | tetrabutylammonium•$HSiF_6$ |
| Additive 15 | hexaflourosilicic acid |
| Additive 16 | tetrabutylammonium fluoride |
| Additive 17 | p-toluenesulfonic acid |
| Additive 18 | sulfuric acid ($H_2SO_4$) |
| Additive 19 | benzenesulfonic acid |

Example 3

Sacrificial Edge Under-Layer

This example demonstrates improved EBR processing based on the application of a sacrificial layer across the surface of the wafer.

A coating solution was applied to form sacrificial under-layer coatings across the entire wafer. The coating solutions comprised 5 wt % polystyrene dissolved in PGMEA and was applied to two wafer with two additional wafers being used as controls. In each case, a 5 mL quantity of the coating solution was dispensed onto a 100 mm wafer rotating at 50 rpm. Immediately after the end of the dispensing process, the wafer was spun at 1500 rpm for 45 s. Then, a 1.5 mL quantity of organo-tin based resist solution R2 was dispensed over three wafers (the two edge coated wafers and one control wafer) in a stationary position, and immediately after the dispense of the resist solution, the respective wafer was spun at 1500 rpm for 45 s.

At the end of the wafer spin to spread the resist solution, the edge bead rinse (EBR) was performed as described in Example 1 and using 5 cycles of rinsing with 5 mL of EBR rinse solution, except for the control wafer without resist where no EBR rinse was performed. The EBR rinse solutions for the control wafer with resist but no edge coating was 65/35 vol % PGME/PGMEA, and for the wafers with sacrificial edge coating, the EBR solvent was either PGMEA or 2-heptanone. Measurements were performed to evaluate tin concentrations along the edges of the 4 wafers, and the results are presented in Table 8. The edge coating significantly improved the EBR process.

TABLE 8

| Wafer | Edge Coating | EBR Solution | VDP-ICP Result Sn (E10 atom/cm$^2$) |
|---|---|---|---|
| 87 | No | None | 12 |
| 88 | No | 65/35 Vol % PGME/PGMEA | 12000 |
| 89 | Yes | PGME | 250 |
| 90 | Yes | 2-heptanone | 18 |

Example 4

Circumferential Anti-Adhesion Coating

This example demonstrates improved EBR processing based on the application of an anti-adhesion edge coating on the wafer.

A coating solution was applied to form anti-adhesion edge coatings. The coating solutions comprised 1 wt % poly(4,5-difluoro-2,2-bis(trifluoro-methyl)-1,3-dioxole-co-tetrafluoro ethylene (FEO) dissolved in perfluorooctane (Solution 1) or in tetradecafluorohexane (Solution 2). Solution 1 and Solution 2 were applied to separate wafers with two additional wafers being used as controls. To apply the coating solution, a 5 mL quantity of the coating solution was dispensed in an EBR apparatus along the edge of a 100 mm wafer rotating at 500 rpm. Immediately after the end of the dispensing process, the wafer was spun at 1500 rpm for 45 s. Then, a 1.5 mL quantity of organo-tin based resist solution R2 was dispensed over three wafers (the two coated wafers and one control wafer) in a stationary position, and immediately after the dispense of the resist solution, the respective wafer was spun at 1500 rpm for 45 s.

At the end of the wafer spin to spread the resist solution, the edge bead rinse (EBR) was performed as described in Example 1 and using 5 cycles of rinsing with 5 mL of EBR rinse solution, except for the control wafer without resist where no EBR rinse was performed. The EBR rinse solutions for the control wafer with resist but no coating was 65/35 vol % PGME/PGMEA, and for the for a first wafer with sacrificial coating EBR was PGMEA, and for wafers with an anti-adhesion edge coating the solvent used for EBR was the same as the solvent used for depositing the coating solution. Measurements were performed to evaluate tin concentrations along the edges of the 4 wafers, and the results are presented in Table 9. The edge coating significantly improved the EBR process.

TABLE 9

| Wafer | Edge Coating | EBR Solution | VDP-ICP Result Sn (E10 atom/cm$^2$) |
|---|---|---|---|
| 91 | No | None | 12 |
| 92 | No | 65/35 Vol % PGME/PGMEA | 12000 |
| 93 | 1% FEO in perfluorooctane | perfluorooctane | 380 |
| 94 | 1% FEO in tetradecafluorohexane | tetradecafluorohexane | 740 |

The embodiments above are intended to be illustrative and not limiting. Additional embodiments are within the claims. In addition, although the present invention has been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein. To the extent that specific structures, compositions and/or processes are described herein with components, elements, ingredients or other partitions, it is to be understood that the disclosure herein covers the specific embodiments, embodiments comprising the specific components, elements, ingredients, other partitions or combinations thereof as well as embodiments consisting essentially of such specific components, ingredients or other partitions or combinations thereof that can include additional features that do not change the fundamental nature of the subject matter, as suggested in the discussion, unless otherwise specifically indicated.

What is claimed is:

1. A method of cleaning a substrate provided with a metal-based resist, the method comprising cleaning a substrate provided with a metal-based resist comprising at least one metal selected from the group consisting of Sn, Hf, Zr, In, Te, Sb, Ni, Co, Ti, W, Ta, and Mo using a metal resist cleaning liquid comprising an organic solvent and a carboxylic acid, thereby removing the metal-based resist from the substrate.

2. The method according to claim 1, comprising applying the metal resist cleaning liquid along the periphery of the substrate to remove an edge bead on the substrate.

3. The method according to claim 1 wherein the organic solvent comprises a propylene glycol methyl ether (PGME), propylene glycol methyl ether acetate (PGMEA), propylene glycol butyl ether (PGBE), ethylene glycol methyl ether, cyclic esters, n-butyl acetate, ether acetate, ketones, liquid cyclic carbonates, or a mixture thereof.

4. The method according to claim 2 wherein the amount of carboxylic acid based on the total weight of the cleaning liquid is 0.1 wt % to 50 wt %.

5. The method according to claim 3 wherein the amount of carboxylic acid based on the total weight of the cleaning liquid is 0.1 wt % to 50 wt %.

6. The method according to claim 1 wherein the metal-based resist comprises Sn.

7. The method of claim 1 wherein the carboxylic acid comprises formic acid and/or acetic acid.

8. A method for removing edge bead on a wafer associated with a resist coating comprising a tin: based resist composition, the method comprising:
applying an edge bead rinse solution along a wafer edge following spin coating of the wafer with the tin organometallic resist composition, wherein the edge bead rinse solution comprises an organic solvent and an additive comprising a carboxylic acid, an inorganic fluorinated acid, a tetraalkylammonium compound, or a mixture thereof,
wherein a residual tin measurement along the wafer edge using VPD-ICP-MS is no more than about $50 \times 10^{10}$ atoms/cm$^2$, and
wherein the carboxylic acid comprises formic acid and/or acetic acid.

9. The method of claim 8 wherein the tin organometallic resist composition comprises alkyl tin oxo/hydroxo moieties.

10. The method of claim 8 wherein the organic solvent comprises a glycol ether or ester thereof, an alcohol, a ketone, a cyclic ester, a liquid cyclic carbonate, or a mixture thereof.

11. The method of claim 8 wherein the organic solvent comprises a propylene glycol methyl ether (PGME), propylene glycol methyl ether acetate (PGMEA), 2-heptanone, or a mixture thereof.

12. The method of claim 8 wherein the additive further comprises acetic acid, citric acid, oxalic acid, 2-nitrophenylacetic acid, 2-ethylhexanoic acid, dodecanoic acid, ascorbic acid, tartaric acid, glucuronic acid, benzene sulfonic acid, p-toluenesulphonic acid, sulfuric acid ($H_2SO_4$), or a mixture thereof.

13. The method of claim 8 wherein the edge bead rinse solution comprises 0.1 wt % to 50 wt % formic acid.

14. The method of claim 11 wherein the edge bead rinse solution comprises 0.1 wt % to 50 wt % formic acid.

15. The method of claim 8 wherein the edge bead rinse solution consists essentially of PGMEA and formic acid in a weight ratio of PGMEA:formic acid from 1:1 to 9:1.

16. The method of claim 8 wherein the edge bead rinse solution consists essentially of PGMEA and acetic acid in a weight ratio of PGMEA:acetic acid from 1:1 to 9:1.

17. A system for performing a bead edge removal comprising:
a spindle comprising a wafer support, wherein the spindle is operably connected to a motor configured to rotate the spindle;
a wafer comprising a surface layer of a tin organometallic resist composition;
a dispenser with a nozzle configured to apply fluid along an edge of the wafer mounted on the spindle; and
a reservoir comprising a fluid, wherein the reservoir is configured to deliver the fluid to the nozzle for dispensing, wherein the fluid comprises an organic solvent with an additive comprising a carboxylic acid, a sulfonic acid, sulfuric acid ($H_2SO_4$), a phosphate ester, a phosphoric acid, an inorganic fluorinated acid, a tetraalkylammonium compound, or mixtures thereof,
wherein the fluid comprises the additive at a concentration from about 0.1 wt % to about 25 wt %,
wherein the carboxylic acid comprises formic acid and/or acetic acid.

18. The system of claim 17 wherein the organic solvent comprises a glycol ether or ester thereof, an alcohol, a ketone, a cyclic ester, a liquid cyclic carbonate, or a mixture thereof.

19. The system of claim 17 wherein the organic solvent comprises propylene glycol methyl ether (PGME), propylene glycol methyl ethyl acetate (PGMEA), propylene glycol butyl ether (PGBE), ethylene glycol methyl ether, ethanol, propanol, isobutyl alcohol, hexanol, ethylene glycol, propylene glycol, 2-heptanone, propylene carbonate, butylene carbonate, or a mixture thereof.

20. The system of claim 17 wherein the tin organometallic resist composition comprises alkyl tin oxo/hydroxo moieties.

* * * * *